(12) United States Patent
Ikegawa et al.

(10) Patent No.: US 12,345,790 B2
(45) Date of Patent: Jul. 1, 2025

(54) MAGNETIC RESONANCE IMAGING APPARATUS AND IMAGING POSITION DETERMINATION METHOD

(71) Applicant: FUJIFILM Healthcare Corporation, Kashiwa (JP)

(72) Inventors: Ayaka Ikegawa, Chiba (JP); Tomohiro Goto, Chiba (JP)

(*) Notice: Subject to any disclaimer, the term of this patent is extended or adjusted under 35 U.S.C. 154(b) by 178 days.

(21) Appl. No.: 18/197,812

(22) Filed: May 16, 2023

(65) Prior Publication Data

US 2023/0384408 A1 Nov. 30, 2023

(30) Foreign Application Priority Data

May 25, 2022 (JP) ................. 2022-085517

(51) Int. Cl.
*G01V 3/00* (2006.01)
*G01R 33/54* (2006.01)
*G01R 33/567* (2006.01)

(52) U.S. Cl.
CPC ....... *G01R 33/5673* (2013.01); *G01R 33/546* (2013.01)

(58) Field of Classification Search
CPC .......................... G01R 33/5673; G01R 33/546
USPC ....................................................... 324/309
See application file for complete search history.

(56) References Cited

U.S. PATENT DOCUMENTS

| 10,219,759 B2 * | 3/2019 | Klahr ............... A61B 6/032 |
| 2013/0154646 A1 | 6/2013 | Nitta et al. |
| 2014/0024924 A1 | 1/2014 | Goto et al. |

(Continued)

FOREIGN PATENT DOCUMENTS

| CN | 103974661 B | * | 8/2016 | ............. A61B 6/032 |
| CN | 109717869 A | * | 5/2019 | ......... G01R 33/5608 |

(Continued)

OTHER PUBLICATIONS

European search report dated Sep. 28, 2023 in connection with European Patent Application No. 23 17 4467.

*Primary Examiner* — Walter L Lindsay, Jr.
*Assistant Examiner* — Frederick Wenderoth
(74) *Attorney, Agent, or Firm* — Paul Teng

(57) ABSTRACT

A technique for automatically setting an imaging position is provided, considering a respiratory motion of a subject, thereby reducing a user's burden and enabling robust imaging against variation of an organ position. Using a scout image acquired over at least one cycle of a periodic motion of the subject, the imaging position for a main imaging is determined according to imaging conditions. At this time, a predetermined tissue is extracted from the scout image, and multiple imaging ranges are calculated, including a minimum imaging range that embraces the tissue and a maximum imaging range that embraces a range where the tissue is displaced within the cycle of the periodic motion. Then, according to the imaging conditions, any of the imaging ranges is determined as the imaging position. When the periodic motion is a respiratory motion, the imaging conditions include a breathing method designated by the user, and the imaging range is selected based on thus designated breathing method, and the imaging position (slice position) is automatically set.

14 Claims, 14 Drawing Sheets

(56) References Cited

U.S. PATENT DOCUMENTS

2014/0347627 A1* 11/2014 Imamura .............. A61B 3/102
                                                     351/246
2020/0008702 A1*  1/2020 Yokosawa ............. A61B 5/742
2020/0330795 A1* 10/2020 Sawant ............... A61N 5/1031

FOREIGN PATENT DOCUMENTS

| CN | 110755075 | A | * | 2/2020 | ............ | A61B 5/055 |
| JP | 2011200342 | A | * | 10/2011 | | |
| JP | 5660807 | B2 | | 12/2014 | | |
| JP | 2020116303 | A | * | 8/2020 | | |

* cited by examiner

MAGNETIC RESONANCE IMAGING APPARATUS AND IMAGING POSITION DETERMINATION METHOD

BACKGROUND OF THE INVENTION

Technical Field

The present disclosure relates to a magnetic resonance imaging (MRI) apparatus that measures a nuclear magnetic resonance (hereinafter, referred to as "NMR") signal, from hydrogen, phosphorus, and others, within a subject, and makes images of a nuclear density distribution and a relaxation-time distribution, for example. In particular, the present disclosure relates to a technique for determining a position where the imaging is performed on the subject.

Description of the Related Art

Usually in an examination using the MRI apparatus, an anatomically-determined cross section is imaged for each examination site, but the body shape and posture of a subject vary from one examination to another. Therefore, even in the case where the same imaging sequence is performed or analysis processing is performed, it is necessary to adjust the imaging position of the subject every time the examination is performed.

In addition, since there is an individual difference in the subject, there may be variations in the above-described operation depending on an operator's skill or similar factors. Especially, the abdomen is a region where the subject's individual difference is large. In the case of the breath-hold imaging, the position of the organ is also changed due to a respiratory phase, and this makes the degree of difficulty higher in setting the imaging position of the subject. From the viewpoint of reducing the burden on the subject, there is a tendency to reduce the breath-hold imaging. In this case, however, the organ position may also vary due to the breathing. Thus, setting the imaging position of the subject considering also the breathing is more difficult, and operator-to-operator variation may further be increased.

In the MRI examination, in addition to the above-described setting of the imaging position, imaging parameters need to be adjusted in accordance with the examination purpose. Therefore, if the setting of the imaging position is inappropriate and causes faulty settings, insufficient imaging range, and occurrence of artifacts associated therewith, re-imaging is to be performed and this increases the burden on the user.

As a technique for reducing the user's burden in setting the imaging position, for example, JP Patent No. 5660807 (hereinafter, referred to as Patent Literature 1) discloses a technique in which a liver is targeted, and an edge of the organ is tracked on the basis of an edge-enhanced image, thereby automatically detecting and setting the imaging position.

SUMMARY OF THE INVENTION

Technical Problem

In the technique described in Patent Literature 1 described above, the organ position is automatically calculated only from the acquired image, and the variation of the organ position due to the subject's breathing is not taken into consideration. Therefore, in the technique of Patent Literature 1, a deviation may occur between the image used for detecting the imaging position and the actual breath-hold imaging position, and failures in imaging are unavoidable due to the variation of the organ position in the subject. In addition, it is necessary to perform the breath-hold imaging in order to control the respiratory motion during imaging, and this causes a large burden on the subject.

An object of the present disclosure is to provide a technique for automatically setting an imaging position considering the respiratory motion of the subject, thereby reducing the burden on the user and enabling robust imaging against variations of the organ position.

Solution to Problem

In order to solve the above problem, a slice position considering the respiratory motion is automatically set based on a predetermined scout scan.

That is, an MRI apparatus of the present disclosure comprises an imaging unit configured to acquire an image of a subject based on nuclear magnetic resonance, and an imaging position determination unit configured to calculate an imaging range of the subject and to determine an imaging position. The imaging position determination unit uses the image acquired by the imaging unit that performs the scout scan, calculates multiple imaging ranges including a minimum imaging range that embraces a predetermined tissue, and a maximum imaging range that embraces a range in which the tissue is displaced within a cycle of a periodic motion, and determines any of the multiple imaging ranges as the imaging position for a main scan according to imaging conditions.

Further, an imaging position determination method of the present disclosure uses a scout image acquired over at least one cycle of a periodic motion of the subject to determine the imaging position of the main imaging according to imaging conditions. At this time, a predetermined tissue is extracted from the scout image, multiple imaging ranges are calculated including a minimum imaging range that embraces the tissue and a maximum imaging range that embraces a range in which the tissue is displaced within a cycle of the periodic motion, and any one of the multiple imaging ranges is determined as the imaging position according to the imaging conditions.

When the periodic motion is a respiratory motion, the imaging conditions include designation of a breathing method employed by the user, and the method selects the imaging range based on the designated breathing method, and automatically sets the imaging position (slice position).

According to the present disclosure, since the imaging position (slice position) is automatically set, on the basis of the body type of the subject, the position and range of the organ, and the phase (respiratory phase) of the periodic motion, it is possible to reduce the burden on the manual operation of the user, to reduce the variation due to the skill difference in operators, and further to prevent the imaging failure and reduce the burden on the subject.

Further, the user is allowed to select the breathing method at the time of imaging, as the imaging condition, and this enables automatic setting of an optimum position and range for the selected breathing method.

DETAILED DESCRIPTION OF THE PREFERRED EMBODIMENTS

Figure 1:
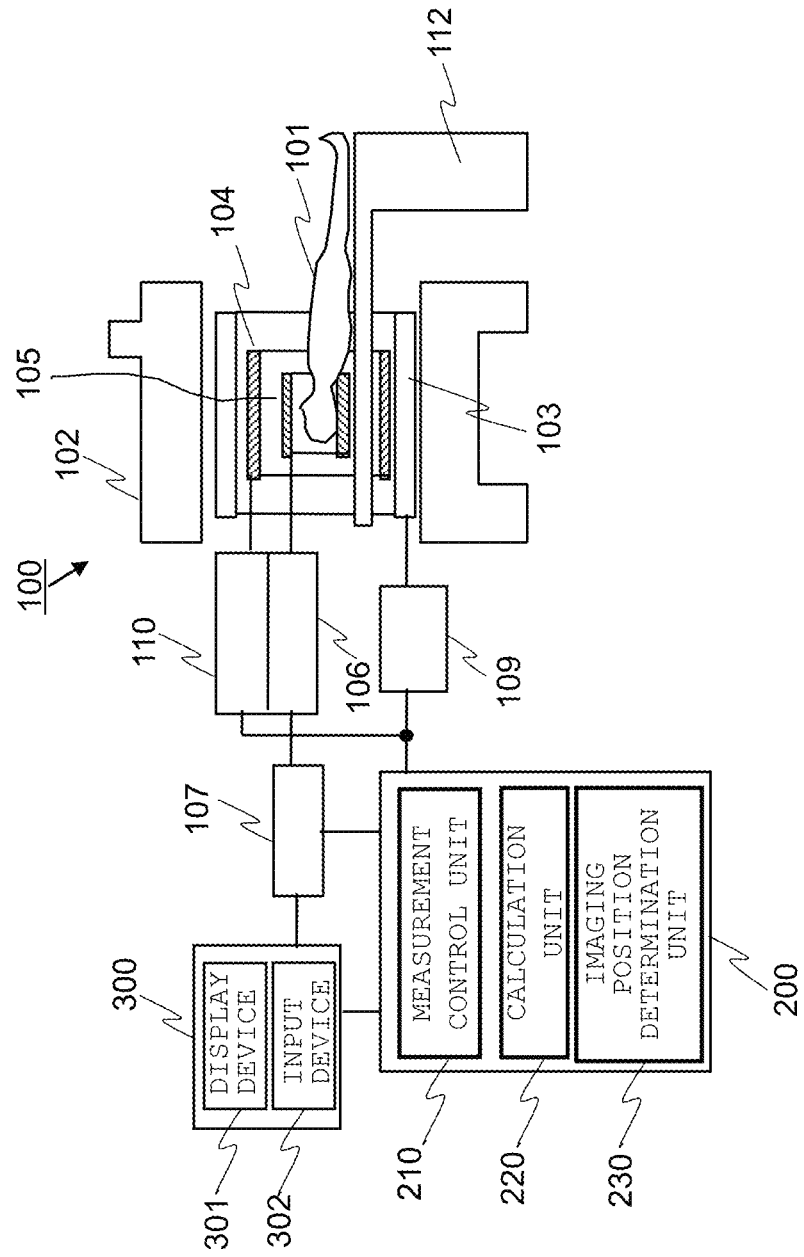
FIG. 1 illustrates an overview of an MRI apparatus according to the present disclosure.

There will now be described embodiments of the present disclosure. In all the drawings for describing the embodiments of the present disclosure, those having the same function are denoted by the same reference numerals, and repetitive description thereof will not be provided. The MRI apparatus according to the present embodiment comprises an imaging unit configured to acquire an image of a subject based on nuclear magnetic resonance, an imaging position determination unit configured to calculate an imaging range of the subject and to determine an imaging position, and a measurement control unit configured to control the imaging unit to perform a scout scan including acquisition of a moving image of one or more cycles of a periodic motion of the subject.

FIG. 1 shows a configuration of a typical MRI apparatus to which the present embodiment is applied. As illustrated, the MRI apparatus comprises an imaging unit 100 including a magnet 102 configured to generate a static magnetic field in a space (examination space) where the subject 101 is placed, a gradient coil 103 configured to generate a gradient magnetic field in the examination space, an RF coil 104 configured to generate an RF magnetic field in a predetermined region of the subject 101, and an RF probe 105 configured to detect MR signals generated by the subject 101, and a computer 200 configured to perform various calculations and others required for controlling the imaging unit 100 and imaging by the imaging unit 100. The computer 200 has functions such as a measurement control unit 210 configured to control the imaging unit 100, a calculation unit 220 configured to perform calculations such as image generation, and an imaging position determination unit 230 configured to perform various calculations related to the imaging position determination. The computer 200 is also connected to a UI unit 300 provided with a display device 301 and an input device 302 for interfacing with a user. The MRI apparatus is further provided with a table 112 for placing the subject in the examination space.

The gradient coil 103 is made up of gradient coils in three directions of X, Y, and Z, and generates gradient magnetic fields, respectively, in response to signals from a gradient power supply 109. The RF coil 104 generates an RF magnetic field in response to signals from an RF transmitter 110. A signal detector 106 detects the signals from the RF probe 105, and a signal processor 107 processes the signals and converts them into image signals by computation.

The gradient magnetic field power supply 109, the RF transmitter 110, and the signal detector 106 perform imaging according to a time chart called a pulse sequence. In the imaging, by applying the RF magnetic field, a nuclear magnetic resonance phenomenon is generated in the nuclei of atoms constituting a tissue of the subject, and nuclear magnetic resonance signals (echo signals) emitted from the subject are detected as a response. At this time, the gradient magnetic fields in the respective directions are combined appropriately, thereby providing different phase encoding to the echo signals, and the signal detector 106 collects the echo signals respectively obtained by the different phase encoding. As the number of phase encoding steps, values such as 128, 256, and 512 are usually selected per image. Each echo signal is typically obtained as a time-series signal consisting of 128, 256, 512, and 1024 sampling data items. The computer 200 performs two-dimensional Fourier transform on these sampling data items to generate one MR image, and displays the image on the display device 301.

The computer 200 is provided with a memory, a CPU, and a GPU, and functions of the measurement control unit 210, the calculation unit (image generation/image processing) 220, and the imaging position determination unit 230 are executed by the CPU and others uploading programs for implementing the functions. However, some of the functions implemented by the computer 200 may also include the functions implemented by a programmable IC such as ASIC and FPGA, and these are also treated as a part of the computer 200.

Figure 2:
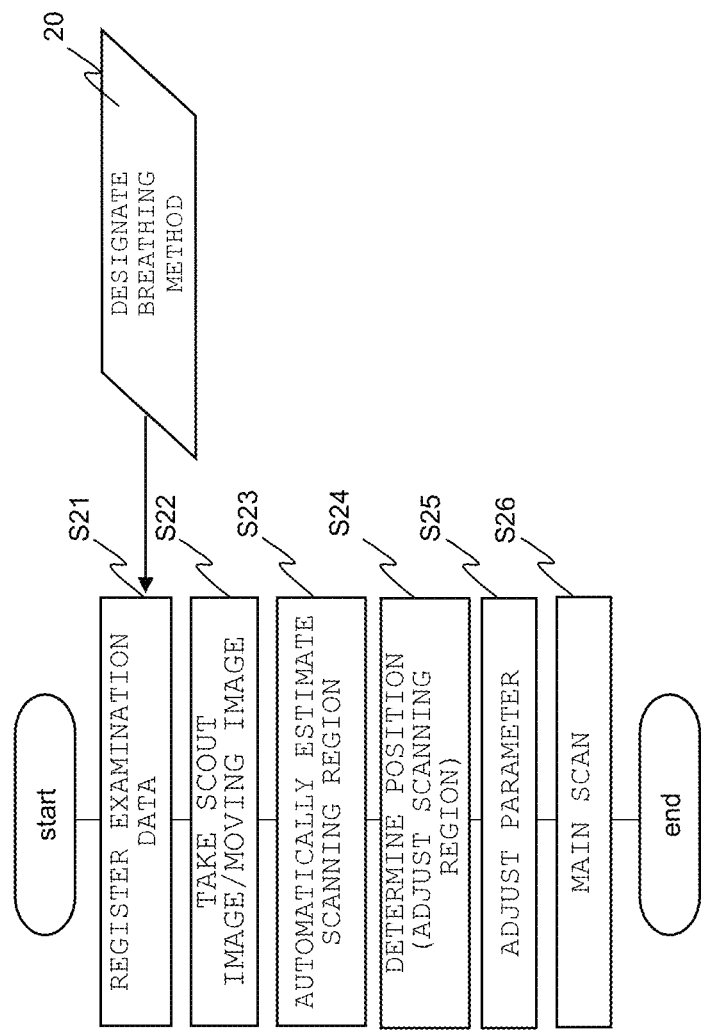
FIG. 2 is a flowchart showing steps of an examination using the MRI apparatus according to the present disclosure.

There will now be described a processing flow of the examination including the setting of the imaging position in the MRI apparatus having the above-described configuration. FIG. 2 is a flowchart showing the control performed by the measurement control unit 210. First, examination data is registered (S21) and then a scout image is taken (S22). The examination data includes information regarding the subject, an examination site (target disease), and examination protocols (imaging types, the order of imaging, and others). The examination data may be entered by a user via the user interface, or the examination data may be read in, which is stored in advance in a medium such as a recording medium. The scout image is a relatively low-resolution image targeted for a wide range of the subject to determine the imaging position. The scout image may be a 2D image or a moving image acquired over at least one cycle of the periodic motion of the subject. Here, the 2D image is distinguished from the moving image, and it is referred to as a 2D scout image.

The imaging position determination unit 230 automatically calculates the imaging range using the scout image (S23) and performs positioning (imaging range adjustment) on the scout image (S24). The automatic calculation of the imaging range and the adjustment thereof will be described in detail in the following embodiments. Along with the adjustment of the Scanning region, parameters are adjusted manually or within the system as needed (S25), and then main scanning for the examination is performed (S26). The parameters to be adjusted (S25) are mainly imaging parameters for determining the pulse sequence, such as a slice thickness, a slice number, a matrix size, and the repetition time TR, and the parameter adjustment is executed when it is required in accordance with the adjustment of the imaging range.

The MRI apparatus of the present embodiment features that the imaging position determination unit 230 uses the scout image acquired by the imaging unit 100 to calculate multiple imaging ranges including a minimum imaging range embracing a predetermined tissue, and a maximum imaging range embracing a range in which the tissue is displaced within a cycle of the periodic motion. Then, according to the imaging conditions, any one of the multiple imaging ranges is determined as the imaging position for the main imaging.

There will now be described specific embodiments of the processing performed by the imaging position determination unit 230.

First Embodiment

In the present embodiment, taking as an example the case where the imaging position is set at a site where a respiratory motion (a motion caused by respiration) occurs, the processing of the imaging position setting unit 230 will be described. The portion where the respiratory motion occurs is mainly the abdomen, and the case where the Scanning region is the abdomen will be described as an example.

In the present embodiment, each of the 2D scout image and the moving image is used in order to set an appropriate imaging position according to the imaging conditions, at the site where the respiratory motion occurs. From these images, the imaging position of the subject and the variation of the position are estimated, and the multiple imaging ranges are calculated using the thus estimated results. Further, based on the calculated imaging ranges, there are determined the user's desired imaging range, a position for acquiring a navigator echo, and others, in response to the imaging method associated with the respiratory motion.

In order to achieve the functions above, the imaging position determination unit 230 of the present embodiment comprises a tissue extraction unit configured to extract an organ as an imaging target using the image acquired by the scout scan, a phase calculation unit configured to calculate a phase of the periodic motion of the subject using the moving image, and an imaging range calculation unit configured to calculate multiple imaging ranges including a minimum imaging range and a maximum imaging range, using the organ position extracted by the tissue extraction unit and the phase of the periodic motion calculated by the phase calculation unit, and according to imaging conditions, the imaging position determination unit 230 determines any one of the multiple imaging ranges, as the imaging position for the main scanning.

Figure 3:
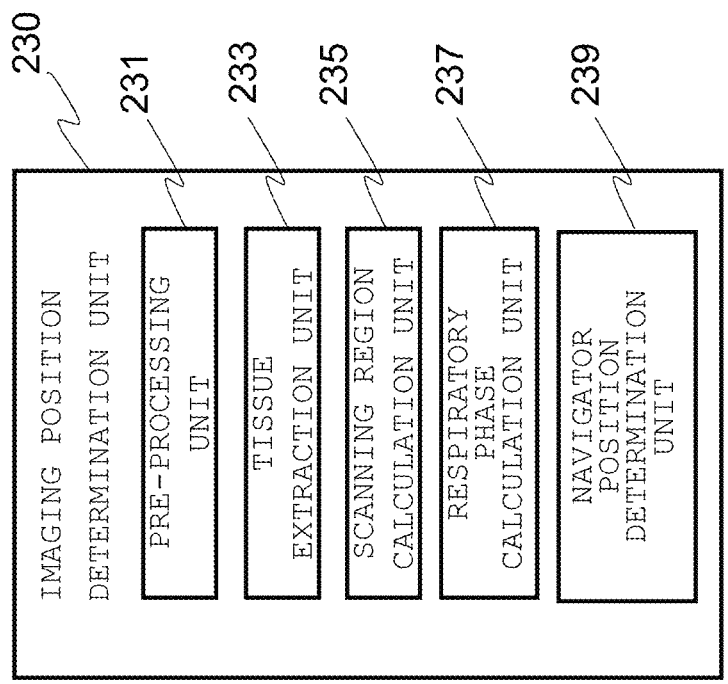
FIG. 3 is a functional block diagram of an imaging position determination unit according to the first embodiment.

FIG. 3 shows an example of a functional block diagram of the imaging position determination unit 230. As illustrated, the imaging position determination unit 230 includes a pre-processing unit 231 configured to perform a pre-processing such as filtering on an image, a tissue extraction unit 233 configured to extract a desired Scanning region from the image after pre-processing, an imaging range calculation unit 235 configured to calculate an imaging range from the extracted Scanning region, a respiratory phase calculation unit 237 configured to calculate a respiratory phase based on the Scanning region with respect to each time-phase, extracted from the moving image, and a navigator position determination unit 239.

Figure 4:
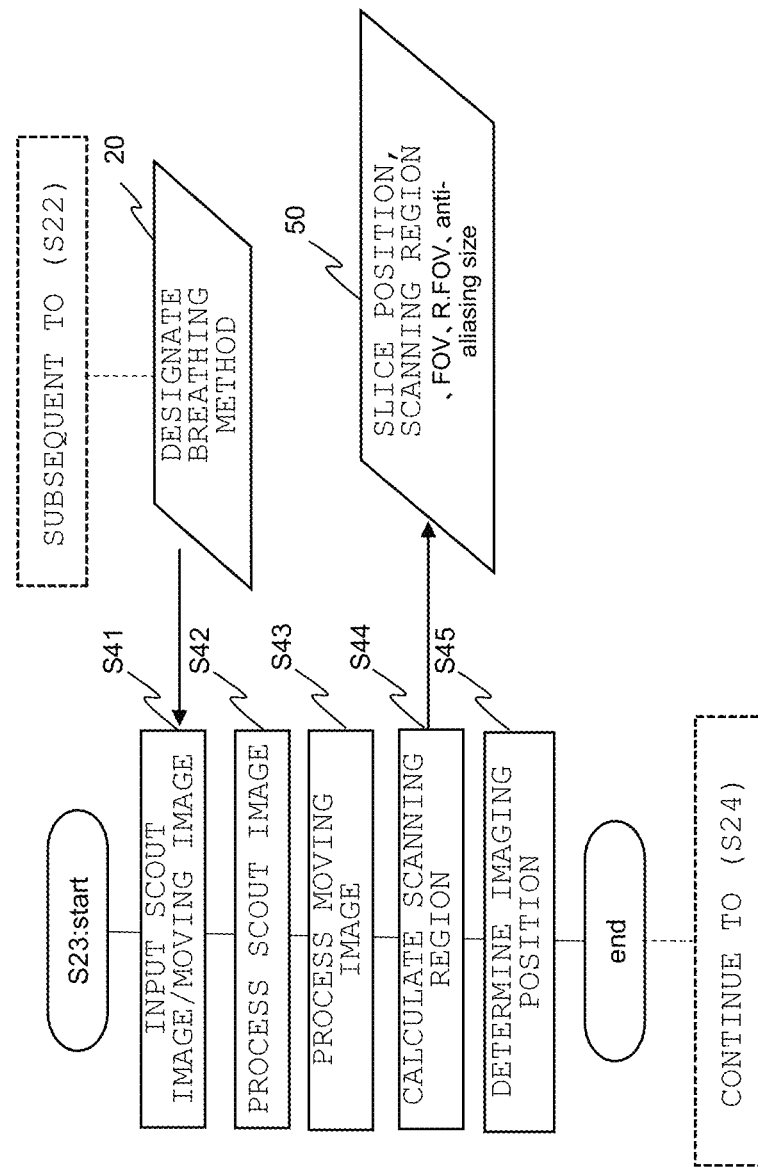
FIG. 4 is a flowchart showing the imaging position determination process according to the first embodiment.

Next, with reference to the flowchart of FIG. 4, there will be described a processing flow of the imaging position determination unit 230. The processing flow of FIG. 2 will be referred to as necessary.

Figure 5:
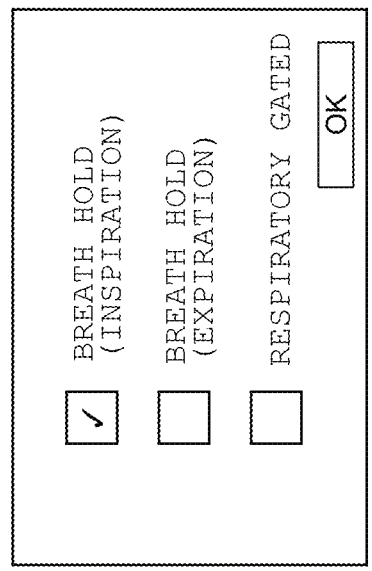
FIG. 5 illustrates an example of GUI for designating a breathing method.

First, at the time of registering examination data (FIG. 2: S21), designation of the breathing method 20 for the subject is accepted via the UI unit 300, as one of the imaging conditions (S41) (FIG. 2: S21). The breathing method is either breath holding or natural breathing, and the user decides the breathing method, considering the state of the subject, the imaging method, and others. The designation of the breathing method for the subject determines the imaging method in accordance with the breathing method. FIG. 5 shows an example of a screen for accepting the designation of the breathing method for the subject, which is displayed on the display device 301. In the illustrated example, a selection of the breath-hold imaging or the respiratory gated imaging (natural breathing) is acceptable. Furthermore, in the case of breath-hold imaging, a selection from the following options is also acceptable; breath holding at the time of inspiration or breath holding at the time of expiration.

The imaging position determination unit 230 inputs the scout image acquired by the imaging unit 100, the moving image continuously imaged at high speed, and the examination data, together with the breathing method designated by the user. Using thus entered information, the system can automatically calculate an imaging range including the imaging target region properly, in accordance with the breathing method designated by the user (S42 to S44).

The automatic calculation process is roughly divided into the following processing steps; a processing on the 2D scout image, a processing on the moving image (S43), an imaging range calculation processing (S44), and an imaging position determination processing (S45). Details of each processing will be described below.

<Scout Image Processing S42>

Figure 6:
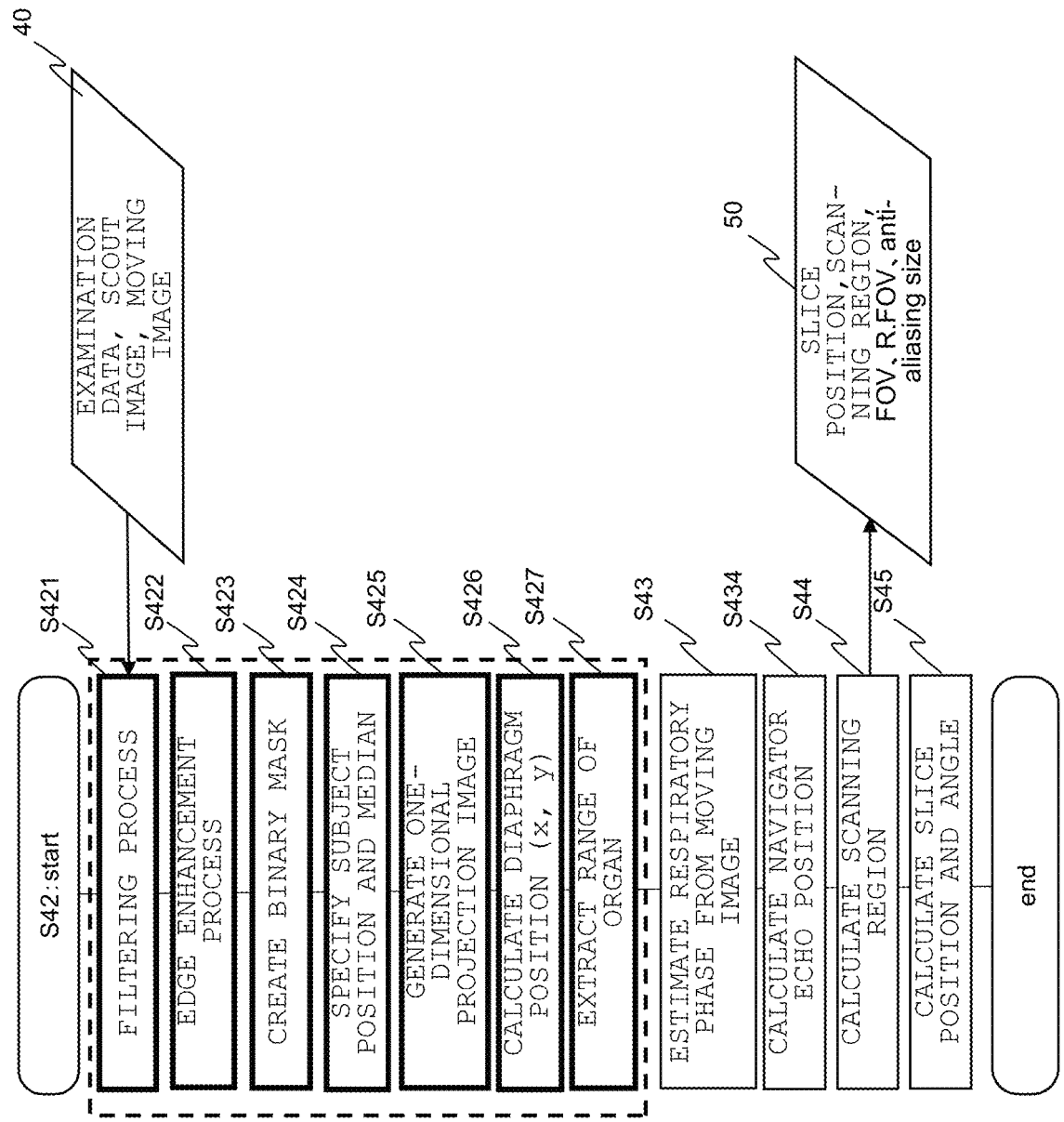
FIG. 6 is a flowchart showing the details of the process of FIG. 4.

The 2D scout image in the abdominal imaging is a low-resolution two-dimensional image including a COR cross section acquired along the body-axis direction of the subject. If needed, an AX cross section and an SAG cross section may be included. As shown in FIG. 6, the pre-processing unit 231 first performs a filtering process for noise reduction on the acquired 2D scout image (S421), and further performs an edge enhancement process for enhancing the contrast of anatomy (S422).

Next, the tissue extraction unit 233 extracts an imaging target region using the scout image after the edge enhancement. For this purpose, first, the scout image after the edge enhancement is binarized using a method such as a discriminant-analysis method, to create a mask where the subject existence region is represented as 1, and the non-existence region is represented as 0 (S423). From this mask, the existence range of the subject is estimated. For example, when the imaging target is the abdomen, the abdomen and the upper limb may be imaged at the same time in the scout image, and the positions of the abdomen and the upper arm are respectively estimated. Once the position of the abdomen is estimated, the median is also estimated using the mask image of the abdomen (S424). For example, the abdomen and the upper arms can be automatically determined from the respective areas and positional relations (such as the distance from the center of the image) of multiple regions having the pixel value 1, and it is possible to employ a known automatic determination algorithm. As for the median estimation, for example, general algorithms have been established and those algorithms are employable, such as a method in which an original image and an inverted image are superimposed one on another, and a vertical bisector between the center of gravity of the original image and the center of gravity of the inverted image is used as the median line of the image.

Figure 7:
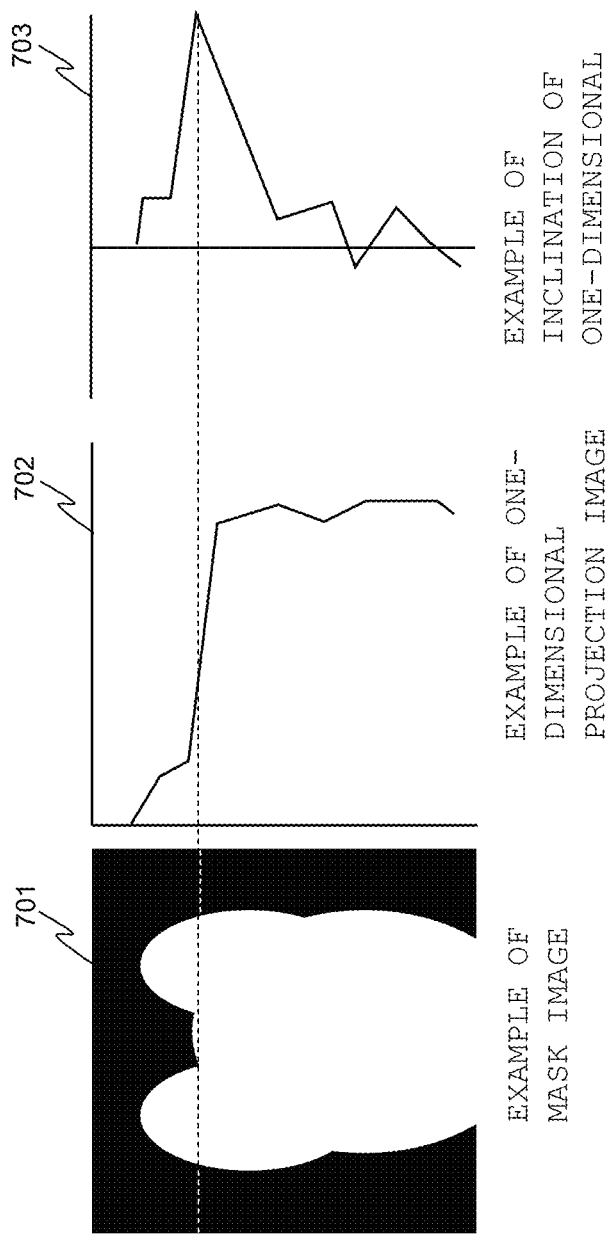
FIG. 7 illustrates examples of a position detection method.

Next, for the image of the abdomen extracted using the mask (referred to as "mask image"), a one-dimensional projection image in the cephalocaudal direction is generated for each of the right half body image and the left half body image divided in the middle, and the boundary position between the lung field and the diaphragm is estimated (S426). With reference to FIG. 7, this process S426 will be described in detail. It is assumed that the mask 701 of the abdomen as shown in FIG. 7 is obtained in the mask image generation step S423. The mask 701 is multiplied by the scout image, and the mask image of the abdomen (not shown) is obtained. This mask image of the abdomen is projected in a direction orthogonal to the body axis, and the one-dimensional projection image 702 in the cephalocaudal direction is obtained. As illustrated, the image of the subject portion has a significant change in signal value between the lung field and the diaphragm. Then, the inclination 703 is obtained for the subject portion of the projected image, and the position at which the largest peak is obtained is estimated as the boundary position (x, y) between the lung field and the diaphragm. Using the estimated pixel as a starting point, the boundary between the mask image and the background is searched on pixel-by-pixel basis, thereby detecting the boundary line between the lung field and the diaphragm.

Subsequently, the position of the Scanning region (for example, the liver) is extracted, using the boundary position (x, y) of the diaphragm as the starting point (S427). For extracting the organ position, publicly-known image processing methods such as Active Shape Model and Region Growing method can be used.

Then, the processing on the two-dimensional scout image (S42) is completed.

<Moving Image Processing S43>

The moving image is an image acquired by the imaging unit 100 that performs imaging over at least one cycle of the respiratory motion of the subject, and the moving image is made up of multiple frame images.

Figure 8:
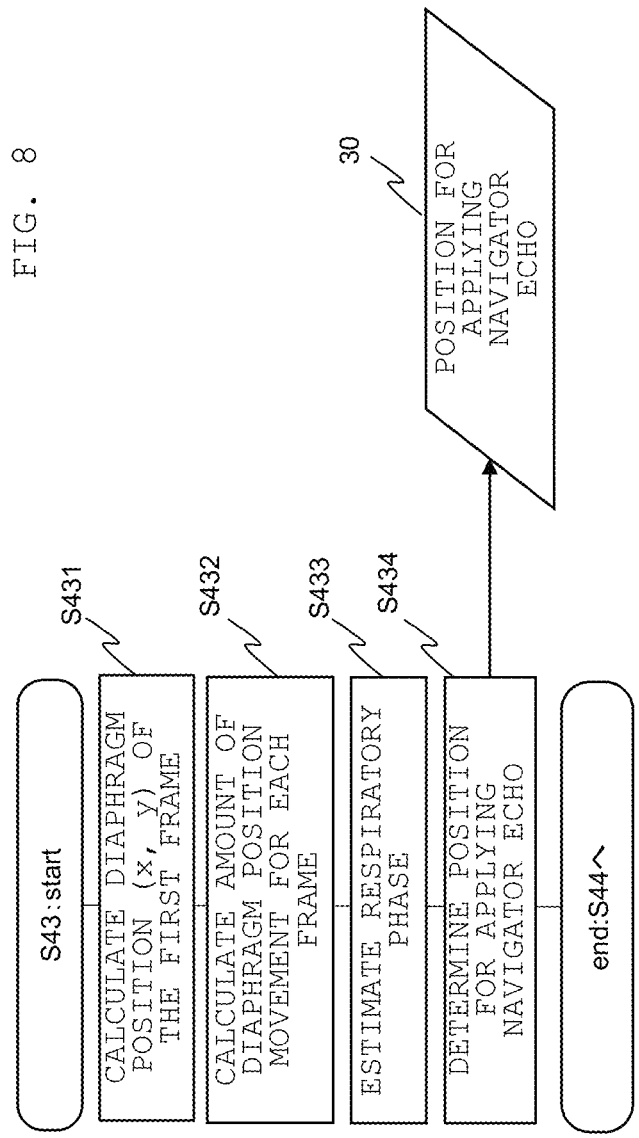
FIG. 8 is a flowchart showing the details of step S43 in FIG. 4.

FIG. 8 shows the details of the processing in step S43. As illustrated, in this step, after the processing (noise removal and edge enhancement) by the pre-processing unit 231 is performed on the moving image, the boundary position (x, y) of the diaphragm is calculated in the first frame image of the moving image after the edge enhancement process, in the same manner as the processing (steps from S423 to S426) for the 2D scout image (S431).

Figure 9:
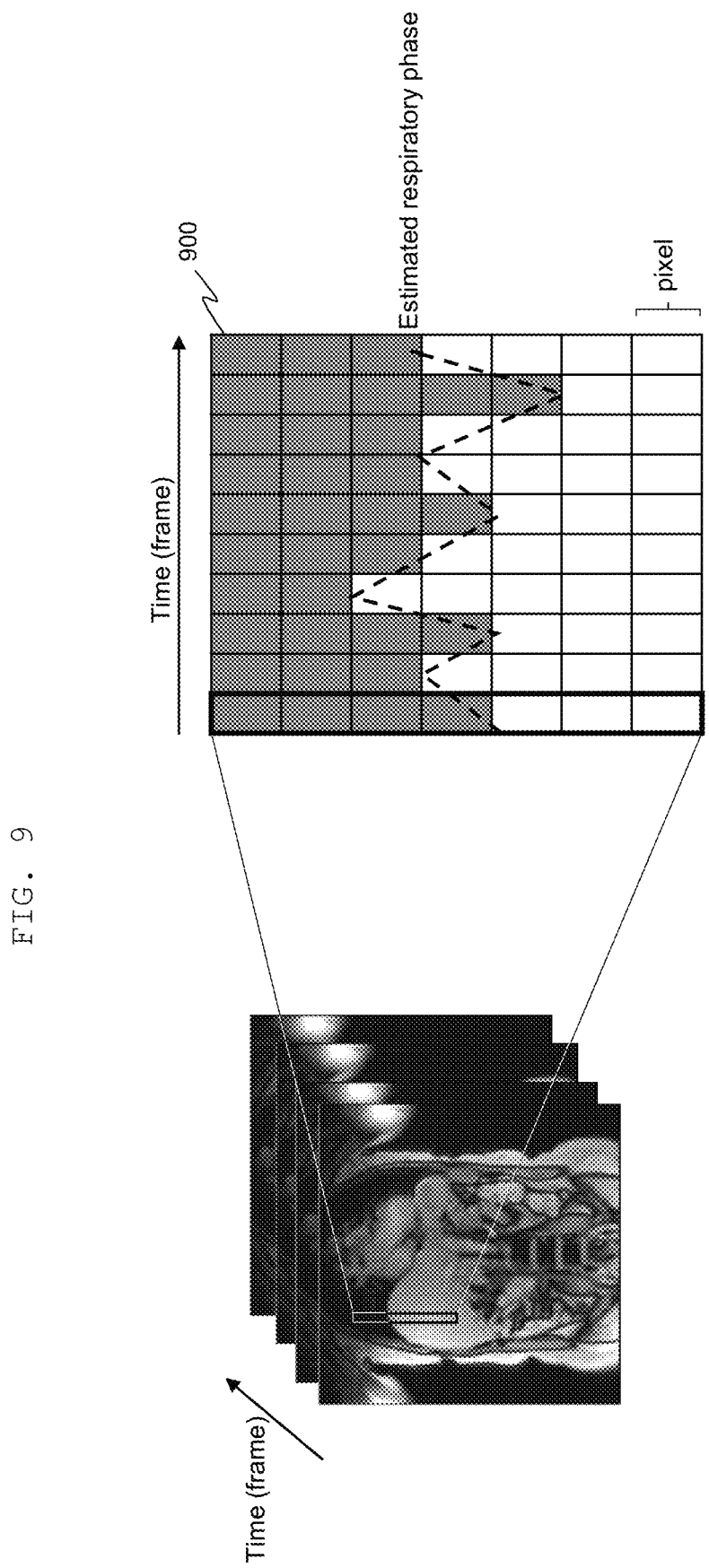
FIG. 9 illustrates estimation of a respiratory phase.

Next, the respiratory phase calculation unit 237 performs the following processing. That is, with the use of a method such as the Optical Flow, the amount of movement for each frame is calculated for the pixels having the feature amount of the boundary position (x, y) (S432). This amount of movement corresponds to the amount of the diaphragm movement caused by breathing. As shown in FIG. 9, the processing above is performed on the frame images of one or more cycle of respiration, and variation 900 in the amount of movement is obtained. FIG. 9 shows an example that estimates the respiratory cycle from the variation of the boundary position (the boundary position where brightness changes from white to black) per frame, with respect to multiple pixels (in the illustrated example, 1×7 pixels) in the cephalocaudal direction including the diaphragm position. According to such variation in the amount of movement, the respiratory phase in the free breathing of the subject is estimated (S433).

The navigator position determination unit 239 sets the boundary position (x, y) of the diaphragm calculated in step S432 as the application position of the navigator echo (S434). When the breathing method (FIG. 2: 20) designated as the imaging condition is the respiratory gated imaging, this information 40 is passed to the imaging unit 100, and the imaging unit 100 performs imaging for acquiring the navigator echo from a region crossing the boundary position of the diaphragm, for instance. In the case where the breath-hold imaging is not selected as the breathing method, this step S434 may be omitted.

<Imaging Range Calculation S44>

Figure 10:
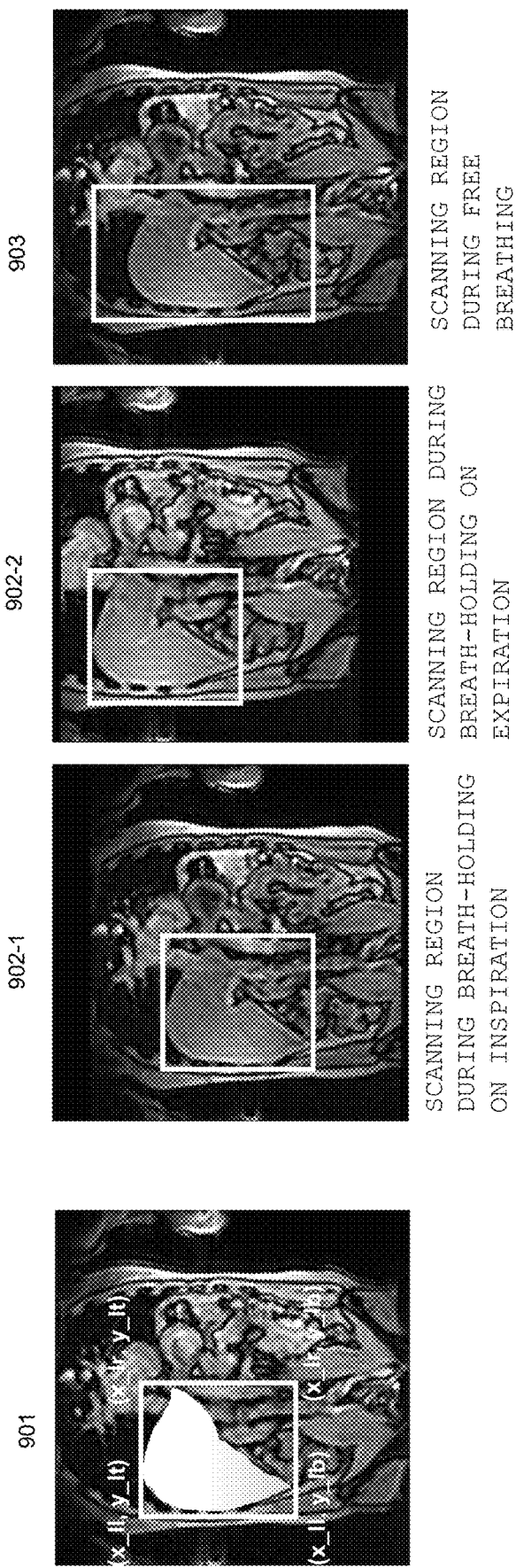
FIG. 10 illustrates determination of multiple imaging ranges.

In this processing, the imaging range is calculated based on the organ position extracted in the above-described step S427. The minimum rectangular range including the upper, lower, left, and right ends on the mask is calculated as the range where the subject exists, and an FOV, rectangular FOV, anti-aliasing size are calculated. With reference to FIG. 10, this process will be described.

FIG. 10 shows an example of a result of the organ position extraction. First, using the extracted liver position image 901, the upper end (x_lt, y_lt), the lower end (x_lb, y_lb), the left end (x_ll, y_ll), and the right end (x_lr, y_lr) of the liver are calculated. A rectangular range circumscribing these four points, that is, the rectangular range connected by (x_ll, y_lt) (x_lr, y_lt) (x_ll, y_lb) and (x_lr, y_lb) is calculated as the minimum imaging range.

Based on the respiratory phase obtained by the processing on the moving image (S43), the liver position extraction is performed from the frame images in each of the inspiratory phase and the expiratory phase. Then, the rectangular ranges 902-1 and 902-2 are obtained for the inspiration and the expiration, respectively, and the range connecting between the upper side (x_ll, y_lt) (x_lr, y_lt) of the rectangular range of the expiration and the lower side (x_ll, y_lb) (x_lr, y_lb) of the rectangular range of the inspiration is calculated as the maximum imaging range 903. Instead of determining the rectangular regions of the inspiration and expiration from the frame images of each phase, the amount of the diaphragm movement per frame obtained in the step S432 may be used. In this case, the respiratory phase of the scout image used for extracting the organ position is specified from the change in the amount of the movement, and the difference in the amount of movement, with respect to the position of inspiration time and the position of expiration time, is added to the rectangular range obtained from the liver position image 901.

According to the processing above, three imaging ranges in total are calculated, i.e., the minimum imaging ranges 902-1 and 902-2 at the time of breath holding, and the imaging range 903 at the time of free breathing. In this way, the optimum imaging range can be provided depending on the breathing state, i.e., breath holding or free breathing.

<Imaging Position Determination S45>

Finally, the imaging position determination unit 230 calculates the imaging position according to the examination data and the entered breathing method. The imaging position includes a slice position and an angle.

Specifically, in step S41, when the breath-hold imaging in expiration is selected, the imaging range is set as the minimum imaging range 902 (902-1, 902-2), and the slice position is calculated such that the upper end of the imaging range corresponds to the position of the expiratory phase. Similarly, in the case where the breath-hold imaging in inspiration is selected, the imaging range is set as the minimum imaging range 902, and the slice position is calculated such that the upper end of the imaging range corresponds to the position of the inspiratory phase.

Further, in step S41, when the imaging in the respiratory gated (free breathing) imaging is selected, the imaging range is set to the maximum imaging range 903, and the slice position is calculated such that the upper end of the imaging range corresponds to the position of the expiratory phase.

The imaging position determination unit 230 delivers to the measurement control unit 210 or to the display device 301, the parameters and numerical values (such as the slice position, imaging range, FOV or RFOV, and anti-aliasing size) 50 for determining the imaging position calculated by the above-described processing S45. The imaging position determination unit 230 automatically sets the position and the angle of the slice line in accordance with the imaging range following the user-designated breathing method (S45). In addition, in the case of scanning task that specifies breathing guidance, the position where the navigator echo is applied is automatically provided.

As described so far, the MRI apparatus according to the present embodiment uses the scout image and the moving image to detect the variation of the organ position due to the respiratory motion (respiratory phase), calculates the minimum imaging range and the maximum imaging range using the result of the detection, and automatically sets the imaging range in accordance with to the breathing method. This configuration allows handling of any imaging; the breath-hold imaging and the free-breathing imaging, and it is further possible to perform imaging in an appropriate imaging range for the breath-hold imaging at any respiratory phase. Accordingly, this reduces the burden on the user associated with the setting of the imaging position, and prevents the imaging failure, as well as achieving reduction of the burden on both the subject and the user.

Second Embodiment

In the first embodiment, the imaging range is automatically set using the scout image, so that the imaging range can be provided according to the body type of the subject. When the imaging range (the FOV, the number of slices, slab thickness, and so on) is changed according to the body type of the subject, there may be a need to change parameters associated therewith. When the value of any associated parameter is changed, the desired imaging conditions already provided may be unintentionally changed. For example, this may cause the following results such as extending the imaging time and reducing the spatial resolution.

In the present embodiment, it is featured to add a function that when adjustment of the imaging parameters becomes necessary in accordance with the automatic setting of the imaging range, the necessity of parameter adjustment is determined to satisfy the user's desired imaging conditions, and the parameter adjustment is automatically performed.

Figure 11:
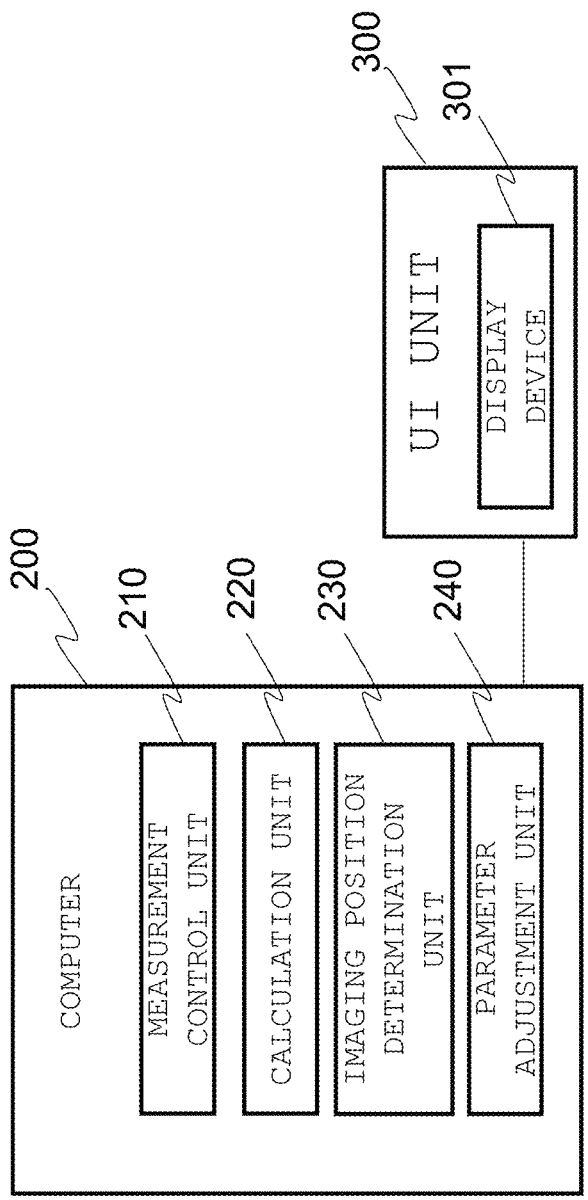
FIG. 11 is a functional block diagram of a computer according to the second embodiment.
Figure 12:
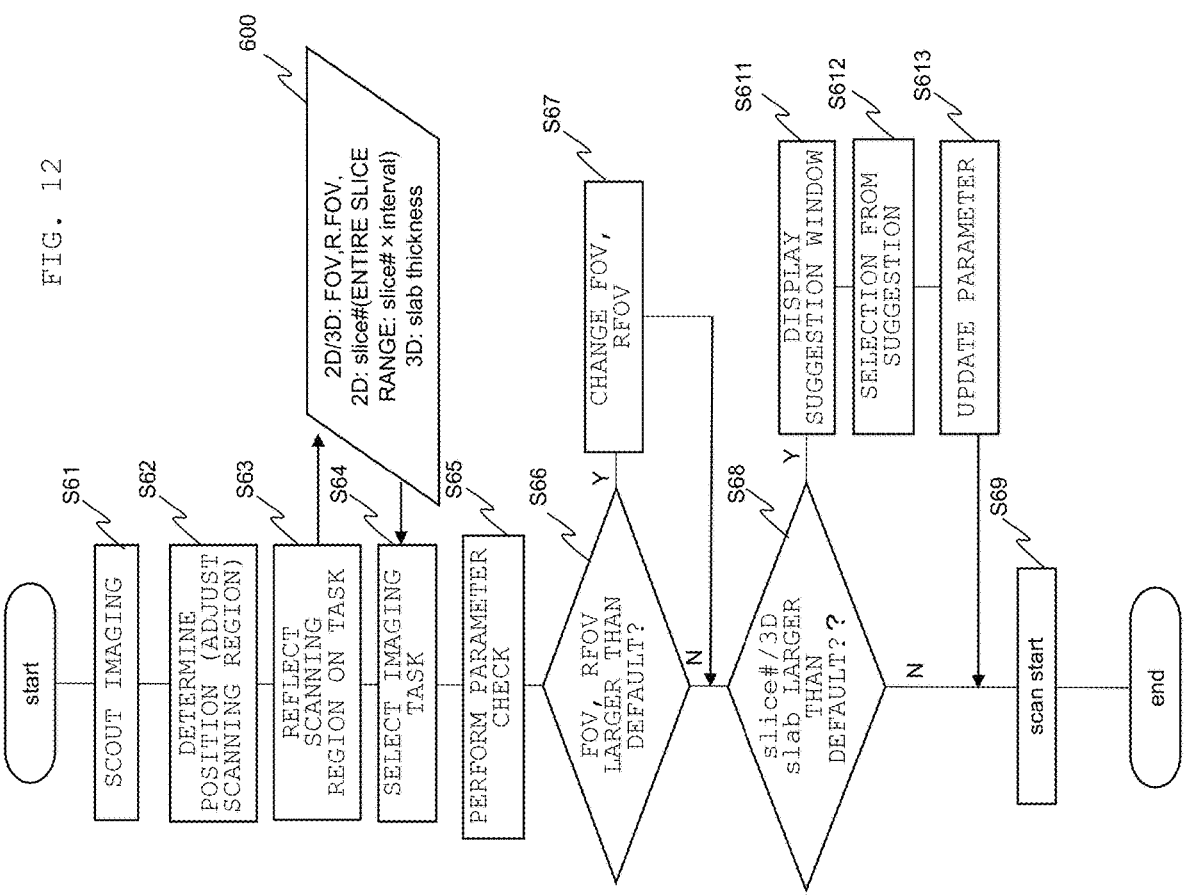
FIG. 12 is a flowchart showing parameter adjustment after determining the imaging position according to the second embodiment.

FIG. 11 is a functional block diagram showing the computer 200 to which the above-described function is added. In FIG. 11, the imaging position determination unit 230 has the same configuration as shown in FIG. 3. As illustrated, in the present embodiment, the parameter adjustment unit 240 is added in the computer 200. With reference to FIG. 12, there will now be described the processing performed by the imaging position determination unit 230 and the parameter adjustment unit 240 of the present embodiment, focusing on the point different from the first embodiment.

Also in the present embodiment, the following steps are the same as those in the first embodiment, i.e., the scout image is taken (S61), the Scanning region on the scout image is calculated, and the imaging position is decided with adjustment as needed (S62). The imaging parameter determined by the decided imaging range is reflected on the parameter of the task for actually taking the examination image (S63).

At this point, parameters 60 related to the imaging range are values manually set by the user or values automatically calculated by the system.

Here, when the user selects the task set with the imaging parameter (S64), the parameter adjustment unit 240 executes the parameter consistency check (S65). In this processing S65 (consistency check), when any of the parameters 60 related to the Scanning region has changed from the default value, it is checked whether there is any other parameter that needs to be changed in conjunction therewith, and a process is performed to calculate a value to be set for the parameter to be changed. Checking whether there is any other parameter to be changed among the parameters 60, in conjunction with the change from the default value, is performed using the information set in the system such as a reference table. For example, when the FOV of the parameters 60 is changed to a value larger than the default value (S66), the imaging will not be disabled with the larger FOV. That is, there are no other parameters needed to be changed. Thus, this value of the parameters 60 is only changed (S67). On the other hand, when the FOV is changed to a value smaller than the default value, this value of the parameters 60 is kept as the default value.

When the slice number in the calculated parameters 60 is larger than the default value (S68), the number of imaging slices increases, and thus imaging time is extended though the imaging itself is possible. In that case, instead of starting the imaging immediately, it is necessary to determine whether or not other parameters need to be changed in accordance with the user's possible desire, such as whether the imaging time is prioritized, or whether an extension of the imaging time is acceptable, for example.

Figure 13:
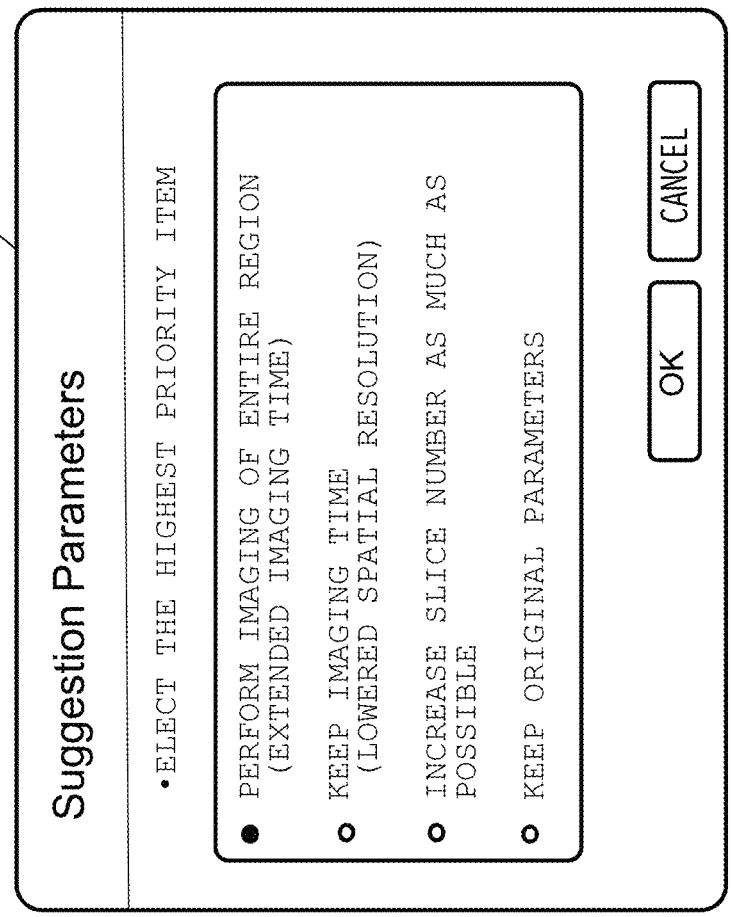
FIG. 13 illustrates an example of GUI for presenting options for the parameter adjustment.

In this situation, changeable parameters and settings are calculated for the patterns respectively in possible cases, and the parameters and settings are displayed on the operating window of the display device 301 (S611 to S613). At this time, the user is presented with options (Suggestion) that serves as a criterion for determining which case (pattern) to select (S611). FIG. 13 shows an example of the Suggestion. In this example, four options are presented: (1) take an image of the required region entirely without reducing the set resolution even extending the total time for the task; (2) take an image covering the required region even with lowered resolution, without extending the time, and (3) reflect the increase of slice number as much as possible acceptable in parameter checking; and (4) use the original (default) parameters. By displaying this kind of Suggestion, it is possible to adjust the parameters according to the priorities of the user. In addition to the options (1) to (4) in the Suggestion, it is possible to display other conventional Suggestions such as the change of TR, to be additionally provided as selectable.

Figure 14:
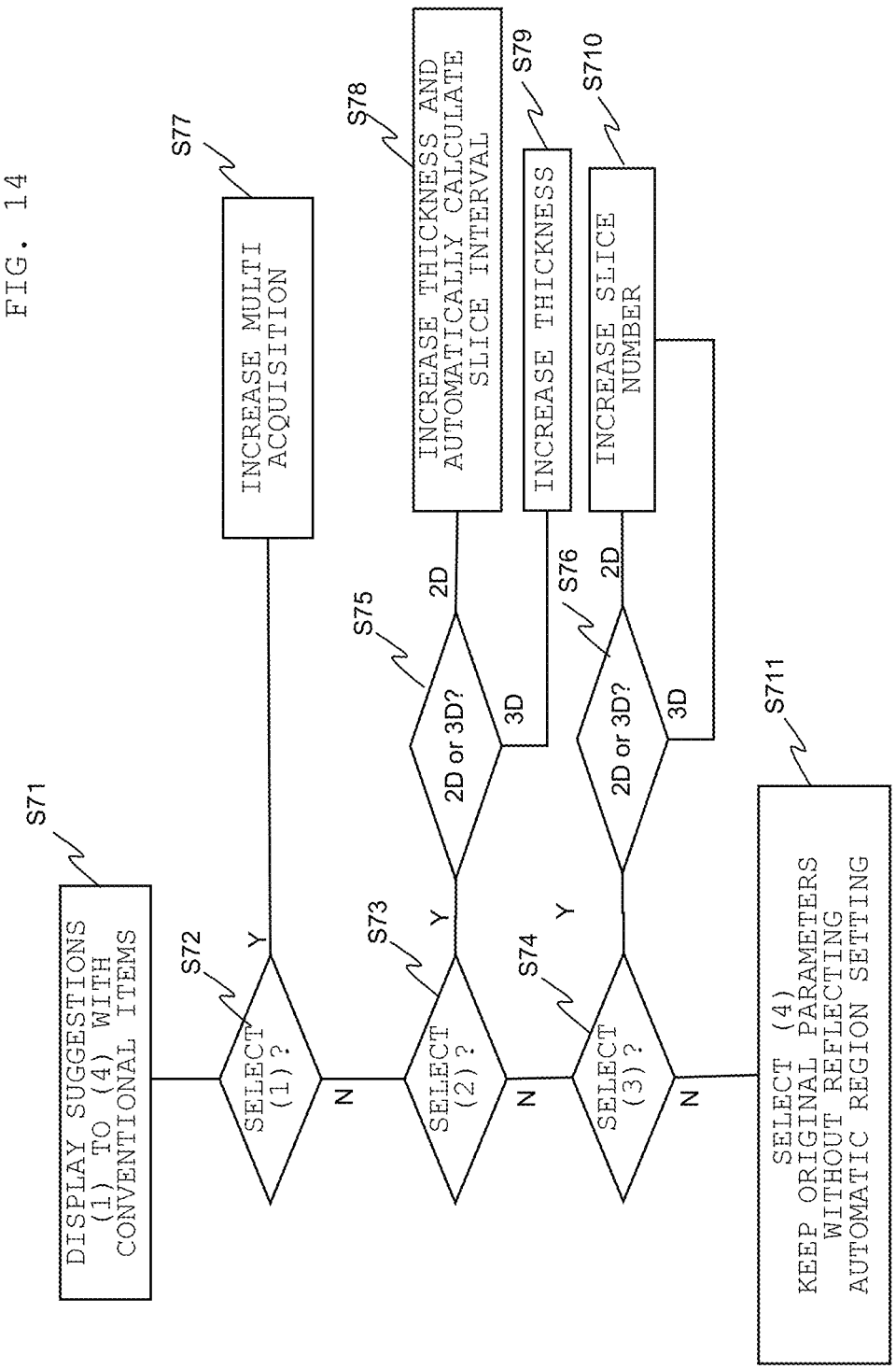
FIG. 14 is a flowchart showing a process at the time of user's selection from the options.

When the user selects a desired case from the options (Suggestions) displayed on the display device 301 (S612), the value of the parameter is changed (S613) to the value of the parameter calculated for the selected case, and then imaging is performed (S69). FIG. 14 is a flowchart showing the processing of automatic calculation by the parameter adjustment unit 240 according to the four options described above.

When the Suggestion is displayed (S71) and the user selects Case (1) (S72), parameters are adjusted to divide the imaging into multiple times (S77). When Case (2) is selected (S73), it is determined whether the imaging is 2D or 3D (S75), and if the imaging is 2D imaging, the slice thickness is increased and the slice interval is automatically calculated (S78), and if the imaging is 3D, the slab thickness is increased (S79). When Case (3) is selected (S74), the number of slices (2D) and the number of slice encoding steps (3D) are increased respectively in the 2D imaging and in the 3D imaging (S76) (S710). When Case (4) is selected (S74), the original status is maintained without any change (S711). At this time, the imaging range is also returned to the value before the adjustment.

According to the present embodiment, in addition to the same effects as those of the first embodiment, it is possible to automatically calculate the parameter in conjunction with the change of the imaging range, and thus it is possible to obtain an effect of reducing the time and trouble of the user. In addition, the operator dependency of the parameter setting is reduced, and this can reduce a setting error that leads to a failure of the examination. Further, since multiple options are presented to the user in an easy-to-understand expression together with the automatic calculation result, the user is allowed to select a desired description of change, thereby enabling parameter setting in accordance with the selected description of change.

What is claimed is:

1. A magnetic resonance imaging apparatus comprising
an imaging unit configured to acquire an image of a subject based on nuclear magnetic resonance and to perform a scout scan to acquire a scout image; and
an imaging position determination unit configured to calculate an imaging range of the subject and determine an imaging position, wherein
the imaging position determination unit uses the scout image, acquired by the imaging unit, to calculate multiple imaging ranges including a minimum imaging range that embraces a predetermined tissue, and a maximum imaging range that embraces a range in which the tissue is displaced within a cycle of a periodic motion, and determines any of the multiple imaging ranges as the imaging position for a main scan according to imaging conditions, the imaging conditions including whether a breathing method of the main scan is natural breathing or breath holding.

2. A method of determining an imaging position of a subject in magnetic resonance imaging comprising,
calculating with an image acquired by performing a scout scan, multiple imaging ranges including a minimum imaging range embracing a predetermined tissue and a maximum imaging range embracing a range where the tissue is displaced within a cycle of a periodic motion, and
determining any of the multiple imaging ranges as the imaging position for a main scan according to imaging conditions, the imaging conditions including whether a breathing method of the main scan is natural breathing or breath holding.

3. The magnetic resonance imaging apparatus according to claim 1, wherein
the imaging position determination unit comprises a tissue extraction unit configured to detect a position and a range of a target organ, using the image acquired by the scout scan.

4. The magnetic resonance imaging apparatus according to claim 1, wherein
the imaging position determination unit calculates a phase of the periodic motion of the subject, from the image acquired by the scout scan.

5. The magnetic resonance imaging apparatus according to claim 1, wherein
the periodic motion is a respiratory motion, and
the magnetic resonance imaging apparatus further comprises a GUI unit configured to display a GUI prompting to select either of breath-hold imaging and respiratory gated imaging as one of the imaging conditions.

6. The magnetic resonance imaging apparatus according to claim 1, wherein
the imaging conditions include a breath-hold imaging, and
the imaging position determination unit determines the imaging position at a position in accordance with a phase of a respiratory motion, setting the minimum imaging range as the imaging range, during the breath-hold imaging.

7. The magnetic resonance imaging apparatus according to claim 1, wherein
the imaging conditions include a respiratory gated imaging, and
the imaging position determination unit determines the imaging position setting the maximum imaging range as the imaging range, during the respiratory gated imaging.

8. The magnetic resonance imaging apparatus according to claim 1, wherein
the imaging conditions include a respiratory gated imaging, and
the imaging position determination unit further comprises a navigator position determination unit configured to determine an application position of a navigator echo that is used in the respiratory gated imaging.

9. The magnetic resonance imaging apparatus according to claim 1, further comprising a parameter adjustment unit configured to adjust any value of imaging parameters in accordance with the imaging range calculated by the imaging position determination unit.

10. The method of determining the imaging position according to claim 2, further comprising:
determining after calculating the imaging ranges, whether or not any of imaging parameters need to be changed, and if the change is needed, a value of the imaging parameter to be changed is calculated.

11. The magnetic resonance imaging apparatus according to claim 9, wherein
the parameter adjustment unit compares the imaging parameters determined by the imaging range, with preset imaging parameters, and determines whether or not any of the imaging parameters is need to be changed.

12. The magnetic resonance imaging apparatus according to claim 9, wherein
the imaging parameters includes a slice thickness, a slice number, and an FOV.

13. The magnetic resonance imaging apparatus according to claim 9, wherein the parameter adjustment unit calculates values of the imaging parameters, according to a priority of the imaging conditions.

14. The magnetic resonance imaging apparatus according to claim 13, wherein
the parameter adjustment presents a GUI prompting a user to select the priority of the imaging conditions.

* * * * *